US012660503B2

(12) United States Patent
Iwase et al.

(10) Patent No.: US 12,660,503 B2
(45) Date of Patent: Jun. 16, 2026

(54) THERMOELECTRIC POWER GENERATION DEVICE, THERMOELECTRIC POWER GENERATION DEVICE COMPONENT, AND MANUFACTURING METHOD THEREFOR

(71) Applicant: WASEDA UNIVERSITY, Tokyo (JP)

(72) Inventors: Eiji Iwase, Tokyo (JP); Shingo Terashima, Tokyo (JP)

(73) Assignee: WASEDA UNIVERSITY, Tokyo (JP)

(*) Notice: Subject to any disclaimer, the term of this patent is extended or adjusted under 35 U.S.C. 154(b) by 166 days.

(21) Appl. No.: 18/566,597

(22) PCT Filed: Jun. 1, 2022

(86) PCT No.: PCT/JP2022/022394

§ 371 (c)(1), (2) Date: Dec. 1, 2023

(87) PCT Pub. No.: WO2022/255426

PCT Pub. Date: Dec. 8, 2022

(65) Prior Publication Data

US 2024/0365668 A1 Oct. 31, 2024

(30) Foreign Application Priority Data

Jun. 4, 2021 (JP) ................................ 2021-094815

(51) Int. Cl.
*H10N 10/82* (2023.01)
*H10N 10/01* (2023.01)
*H10N 10/13* (2023.01)

(52) U.S. Cl.
CPC ............ *H10N 10/82* (2023.02); *H10N 10/01* (2023.02); *H10N 10/13* (2023.02)

(58) Field of Classification Search
CPC ......... H10N 10/82; H10N 10/13; H10N 10/01
See application file for complete search history.

(56) References Cited

U.S. PATENT DOCUMENTS

2011/0220162 A1 9/2011 Siivola et al.

FOREIGN PATENT DOCUMENTS

JP H04030586 * 2/1992
JP 2008192970 A 8/2008
(Continued)

OTHER PUBLICATIONS

Francioso, et al. "Flexible thermoelectric generator for ambient assisted living wearable biometric sensors" Journal of Power Sources 196 (2011) 3239-3243.

(Continued)

*Primary Examiner* — Uyen M Tran
(74) *Attorney, Agent, or Firm* — Rimon P.C.

(57) ABSTRACT

A thermoelectric power generation device includes a beam portion, a first leg portion, and a second leg portion formed integrally with a wiring substrate. The beam portion, the first leg portion, and the second leg portion are curved and deformed, and the first contact portion and the second contact portion integrally formed at the distal ends of the first leg portion and the second leg portion, respectively, are mounted in close contact with a heat source. The first leg portion and the second leg portion rise obliquely upward from the heat source, and the beam portion connected to the base ends of the first leg portion and the second leg portion is disposed above the heat source. Thermoelectric elements are mounted to the first leg portion and the second leg portion.

10 Claims, 10 Drawing Sheets

(56) References Cited

FOREIGN PATENT DOCUMENTS

| | | | |
|---|---|---|---|
| JP | 2014007357 | A | 1/2014 |
| JP | 2017092437 | A | 5/2017 |
| JP | 2017216388 | A | 12/2017 |
| JP | 2020047818 | A | 3/2020 |
| WO | 2017038773 | A1 | 3/2017 |
| WO | 2017038525 | A1 | 9/2017 |

OTHER PUBLICATIONS

Zhisong Lu, et al. "Silk fabric-based wearable thermoelectric generator for energy harvesting from the human body" Applied Energy 164 (2016) 57-63.

Corey A. Hewitt, et al. "Multilayered Carbon Nanotube/Polymer Composite Based Thermoelectric Fabrics" American Chemical Society, Nano Lett. 2012, 12, 1307-1310.

Tohru Sugahara, et al. "Fabrication with Semiconductor Packaging Technologies and Characterization of a Large-Scale Flexible Thermoelectric" Adv. Mater. Technol. 2019, 4, 1800556 (1-5).

International Search Report received in PCT Application No. PCT/JP2022/022394, dated Aug. 9, 2022.

Terashima, S. et al. "Flexible Thermoelectric Generator Using Kirigami-Folding Structure", Transducers 2021 Virtual Conference, Jun. 20-24, 2021, 4 pages.

Terashima, S. et al. "Kirigami Thermoelectric Gererator With High Flexibility and High Performance", IEEE MEMS 2022, Jan. 9-13, 2022, 4 pages.

Extended European Search Report dated May 19, 2025, issued in corresponding European Patent Application No. 22816171.7, 6 pages.

* cited by examiner (A)

(B)

(C)

(A)

(B)

THERMOELECTRIC POWER GENERATION DEVICE, THERMOELECTRIC POWER GENERATION DEVICE COMPONENT, AND MANUFACTURING METHOD THEREFOR

CROSS-REFERENCE TO RELATED APPLICATIONS

This application is the U.S. National Phase under 35 U.S.C. § 371 of International Application No. PCT/JP2022/022394, filed on Jun. 1, 2022, which claims the benefit of foreign priority to Japanese Patent Application No. JP2021-094815, filed on Jun. 4, 2021, the entire contents of each of which are hereby incorporated by reference.

TECHNICAL FIELD

The present invention relates to a thermoelectric power generation device, a thermoelectric power generation device component, and a method for manufacturing the same.

BACKGROUND ART

A thermoelectric power generation device that converts thermal energy into electric energy by the Seebeck effect using a solid thermoelectric element is known. As such a thermoelectric power generation device, a π-type structure in which a set of thermoelectric elements is disposed between two substrates and a flat-type structure (see, for example, PTL 1 and NPLs 1 to 3) in which thermoelectric elements are formed in a thin film shape on a substrate surface are known.

The thermoelectric power generation device includes a set of thermoelectric elements, that is, p-type and n-type thermoelectric elements (semiconductors). Since a set of thermoelectric elements has a small output, multiple sets of thermoelectric elements are generally used. In the thermoelectric power generation device described in PTL 1, a large number of sets of thin-film thermoelectric elements are formed on a substrate, and the substrate is formed in a bellows shape having a repeated mountain fold and valley fold structure, so that there is a difference in distance from a heat source in each of mountain and valley portions, and a temperature difference between both ends (mountain side and valley side) of the thermoelectric elements formed between the mountain and valley is increased. In addition, there is also known a thermoelectric power generation device in which a large number of sets of thermoelectric elements having a n-type structure are provided on a flexible substrate, and a large number of electrodes connecting ends of the thermoelectric elements on a side opposite to the flexible substrate are arranged in a specific manner, so that the thermoelectric power generation device can be curved in a specific one direction (see NPL 4).

On the other hand, there has been proposed a printed circuit board that can be bent 180 degrees while reducing a burden on a base material of the printed circuit board and preventing cutting of wiring on the base material due to bending or the like by making a cut in a rectangular printed circuit board to have a substantially N-shape (see PTL 2).

CITATION LIST

Patent Literature

PTL 1: JP 2017-92437 A
PTL 2: JP 2020-47818 A

Non Patent Literature

NPL 1: L. Francioso, C. De Pascali, I. Farella, C. Martucci, P. Creti, P. Siciliano, A. Perrone, "Flexible thermoelectric generator for ambient assisted living wearable biometric sensors", J. Power Sources, 196 (2011).

NPL 2: Z. Lu, H. Zhang, C. Mao, C. M. Li, "Silk fabric-based wearable thermoelectric generator for energy harvesting from the human body", Appl. Energy, 164, pp. 57-63 (2016).

NPL 3: C. A. Hewitt, A. B. Kaiser, S. Roth, M. Craps, R. Czerw, D. L. Carroll, "Multilayered carbon nanotube/polymer composite based thermoelectric fabrics", Nano Lett., 12, pp. 1307-1310 (2012).

NPL 4: T. Sugahara, Y. Ekubaru, N. V. Nong, N. Kagami, K. Ohata, L. T. Hung, M. Okajima, S. Nambu, and K. Suganuma, "Fabrication with Semiconductor Packaging Technologies and Characterization of a Large-Scale Flexible Thermoelectric Module", Advanced Materials Technologies (2019).

SUMMARY OF THE INVENTION

Technical Problem

However, in the thermoelectric power generation device in which the substrate is formed in a bellows shape as in PTL 1 and the thermoelectric power generation device in which the substrate is bent only in one direction as in NPL 4, floating partially occurs depending on the shape of the surface of the heat source, and the thermoelectric power generation devices of PTL 1 and NPL 1 have a problem that power generation efficiency is poor because a thin-film thermoelectric element is used.

The present invention has been made in view of the above circumstances, and an object of the present invention is to provide a thermoelectric power generation device, a thermoelectric power generation device component, and a method for manufacturing the same, which can improve power generation efficiency.

Solution to Problem

A thermoelectric power generation device of the present invention includes: a flexible wiring substrate having an insulating base material and a metal layer formed on one surface of the base material; and a p-type thermoelectric element and an n-type thermoelectric element provided on the wiring substrate, wherein the wiring substrate includes: a strip-shaped beam portion provided with a first connecting portion protruding outward in a width direction of the beam portion at one end and a second connecting portion protruding in a direction opposite to the first connecting portion at the other end; a first leg portion extending in a strip shape from an end portion of the first connecting portion on the other end side of the beam portion toward the other end side of the beam portion in a direction away from the beam portion on one surface side of the beam portion, and having a distal end provided with a first contact portion which is configured to be in contact with a heat source; and a second leg portion extending in a strip shape from an end portion of the second connecting portion on the one end side of the beam portion toward the one end side of the beam portion in a direction away from the beam portion on the one surface side of the beam portion, and having a distal end provided with a second contact portion that is configured to be in contact with a heat source on the one end side of the beam portion with respect to the first contact portion, the metal layer is electrically separated into a first wiring region on the distal end side of the first leg portion, a second wiring region on the distal end side of the second leg portion, and a connection wiring region from a first insulating region to a second insulating region via the beam portion by the first insulating region formed between a base end and the distal end of the first leg portion and the second insulating region formed between a base end and the distal end of the second leg portion, the p-type thermoelectric element is mounted on the first leg portion to connect the connection wiring region and the first wiring region, and the n-type thermoelectric element is mounted on the second leg portion to connect the connection wiring region and the second wiring region.

A thermoelectric power generation device of the present invention includes: a flexible wiring substrate having an insulating base material and a metal layer formed on one surface of the base material; and a p-type thermoelectric element or an n-type thermoelectric element provided on the wiring substrate, wherein the wiring substrate includes: a strip-shaped beam portion provided with a first connecting portion protruding outward in a width direction of the beam portion at one end and a second connecting portion protruding in a direction opposite to the first connecting portion at the other end; a first leg portion extending in a strip shape from an end portion of the first connecting portion on the other end side of the beam portion toward the other end side of the beam portion in a direction away from the beam portion on one surface side of the beam portion, and having a distal end provided with a first contact portion which is configured to be in contact with a heat source; and a second leg portion extending in a strip shape from an end portion of the second connecting portion on the one end side of the beam portion toward the one end side of the beam portion in a direction away from the beam portion on the one surface side of the beam portion, the metal layer formed in the second leg portion being narrower than in the first leg portion, and has a distal end provided with a second contact portion that is configured to be in contact with a heat source on the one end side of the beam portion with respect to the first contact portion, the metal layer is electrically separated into a first wiring region on the distal end side of the first leg portion and a second wiring region from a first insulating region to the second contact portion via the beam portion by the first insulating region formed between a base end and the distal end of the first leg portion, and the thermoelectric element is mounted on the first leg portion to connect the first wiring region and the second wiring region.

A thermoelectric power generation device component according to the present invention includes: a flexible planar wiring insulating base material and a metal layer formed on one surface of the base material; and a p-type thermoelectric element and an n-type thermoelectric element provided on the wiring substrate, wherein the wiring substrate includes: a strip-shaped beam portion region provided with a first connecting portion region protruding outward in a width direction of the beam portion region at one end and a second connecting portion region protruding in a direction opposite to the first connecting portion region at the other end; a first leg portion region extending in a strip shape from an end portion of the first connecting portion region on the other end side of the beam portion region to the other end side of the beam portion region and having a distal end provided with a first contact portion region which is configured to be in contact with a heat source; and a second leg portion region extending in a strip shape from an end portion of the second connecting portion region on the one end side of the beam portion region to the one end side of the beam portion region and having a distal end provided with a second contact portion region which is configured to be in contact with a heat source, the beam portion region, the first leg portion region, and the second leg portion region being formed by cut lines, the metal layer is electrically separated into a first wiring region on the distal end side in the first leg portion region, a second wiring region on the distal end side in the second leg portion region, and a connection wiring region from a first insulating region to a second insulating region via the beam portion region by the first insulating region formed between a base end and the distal end of the first leg portion region and a second insulating region formed between a base end and the distal end of the second leg portion region, the p-type thermoelectric element is mounted on the first leg portion region to connect the connection wiring region and the first wiring region, and the n-type thermoelectric element is mounted on the second leg portion region to connect the connection wiring region and the second wiring region.

A thermoelectric power generation device component according to the present invention includes: a flexible planar wiring substrate having an insulating base material and a metal layer formed on one surface of the base material; and a p-type thermoelectric element or an n-type thermoelectric element provided on the wiring substrate, wherein the wiring substrate includes: a strip-shaped beam portion region provided with a first connecting portion region protruding outward in a width direction of the beam portion region at one end and a second connecting portion protruding in a direction opposite to the first connecting portion region at the other end; a first leg portion region extending in a strip shape from an end portion of the first connecting portion region on the other end side of the beam portion region to the other end side of the beam portion region and having a distal end provided with a first contact portion region which is configured to be in contact with a heat source; and a second leg portion region extending in a strip shape from an end portion of the second connecting portion region on one end side of the beam portion region to the one end side of the beam portion region, the metal layer formed in the second leg portion region being narrower than in the first leg portion region and having a distal end provided with a second contact portion region which is configured to be in contact with a heat source, the beam portion region, the first leg portion region, and the second leg portion region being formed by cut lines, the metal layer is electrically separated into a first wiring region on the distal end side in the first leg portion region and a second wiring region from a first insulating region to the second contact portion region via the beam portion by the first insulating region formed between a base end and the distal end of the first leg portion region, and the thermoelectric element is mounted on the first leg portion region to connect the first wiring region and the second wiring region.

A method for manufacturing a thermoelectric power generation device component according to the present invention includes: a dividing step of forming cut lines on a flexible wiring substrate including an insulating base material and a metal layer formed on one surface of the base material to divide the flexible wiring substrate into a strip-shaped beam portion region provided with a first connecting portion region protruding outward in a width direction of the beam portion region at one end and a second connecting portion region protruding in a direction opposite to the first connecting portion region at the other end, a first leg portion region extending in a strip shape from an end portion of the first connecting portion region on the other end side of the beam portion region to the other end side of the beam portion region and having a distal end provided with a first contact portion region which is configured to be in contact with a heat source, and a second leg portion region extending in a strip shape from an end portion of the second connecting portion region on the one end side of the beam portion region to the one end side of the beam portion region and having a distal end provided with a second contact portion region which is configured to be in contact with a heat source; a metal layer processing step of forming a first insulating region between a base end and the distal end of the first leg portion region and a second insulating region between a base end and the distal end of the second leg portion region, and electrically separating the metal layer into a first wiring region on the distal end side in the first leg portion region, a second wiring region on the distal end side in the second leg portion region, and a connection wiring region from the first insulating region to the second insulating region via the beam portion region; and a thermoelectric element mounting step of mounting a p-type thermoelectric element on the first leg portion region to connect the connection wiring region and the first wiring region, and mounting an n-type thermoelectric element on the second leg portion region to connect the connection wiring region and the second wiring region.

A method for manufacturing a thermoelectric power generation device component according to the present invention includes: a dividing step of forming cut lines on a flexible wiring substrate including an insulating base material and a metal layer formed on one surface of the base material to divide the flexible wiring substrate into a strip-shaped beam portion region provided with a first connecting portion region protruding outward in a width direction of the beam portion region at one end and a second connecting portion region protruding in a direction opposite to the first connecting portion region at the other end, a first leg portion region extending in a strip shape from an end portion of the first connecting portion region on the other end side of the beam portion region to the other end side of the beam portion region and having a distal end provided with a first contact portion region which is configured to be in contact with a heat source, and a second leg portion region extending in a strip shape from an end portion of the second connecting portion region on the one end side of the beam portion region to the one end side of the beam portion region and having a distal end provided with a second contact portion region which is configured to be in contact with a heat source; a metal layer processing step of forming a first insulating region between a base end and the distal end of the first leg portion region, electrically separating the metal layer into a first wiring region on the distal end side in the first leg portion region and a second wiring region from the first insulating region to the second contact portion region via the beam portion region, and making the metal layer in the second leg portion region narrower than in the first leg portion region; and a thermoelectric element mounting step of mounting a p-type thermoelectric element or an n-type thermoelectric element on the first leg portion region to connect the first wiring region and the second wiring region.

Advantageous Effects of the Invention

According to the present invention, since the first leg portion and the second leg portion rise obliquely from the heat source, each thermoelectric element can be separated from the heat source to generate a large temperature difference in the thermoelectric element. Since there is a degree of freedom in an interval between and positions of the first contact portion and the second contact portion, and the first contact portion and the second contact portion can be favorably brought into close contact with the heat source, power generation efficiency is improved.

DESCRIPTION OF EMBODIMENTS

Figure 1:
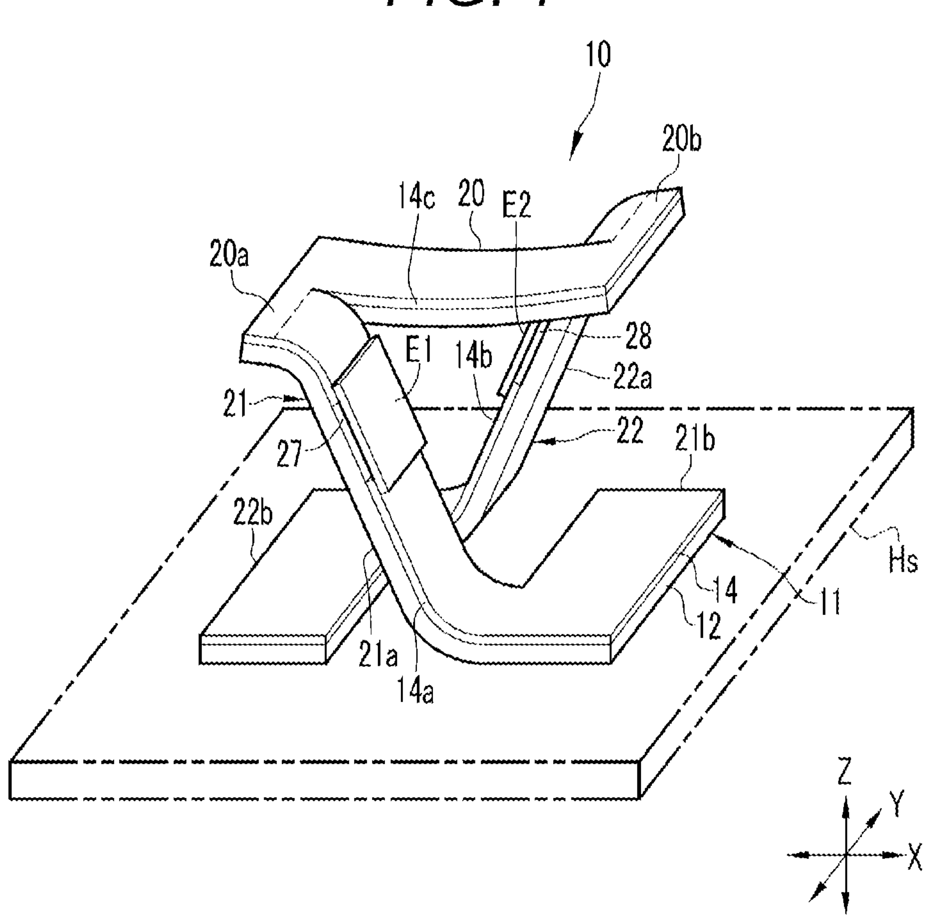
FIG. 1 is a perspective view illustrating a thermoelectric power generation device according to an embodiment.

In FIG. 1, a thermoelectric power generation device 10 is used by being mounted to a heat source Hs such as an engine, a pipe, and an electronic device. The thermoelectric power generation device 10 is obtained by deforming a wiring substrate 11 to which thermoelectric elements E1 and E2 are fixed into a predetermined shape, and is mounted to the heat source Hs in a deformed state. Hereinafter, the description will be given assuming that the thermoelectric power generation device 10 is attached to the upper surface of the heat source Hs, but the posture or the like of the thermoelectric power generation device 10 with respect to the heat source Hs is not limited. As an example, the surface of the heat source Hs to which the thermoelectric power generation device 10 is mounted (hereinafter, referred to as a heat source surface) will be described as a flat surface.

However, as described later, the heat source surface to which the thermoelectric power generation device 10 is mounted is not limited to a flat surface.

The wiring substrate 11 has a configuration in which a metal layer 14 is formed on an upper surface of a base film 12 as a base material, and has flexibility. The base film 12 is made of an insulating resin, in this example, polyimide. In this example, the base film 12 has flexibility, and the flexibility of the wiring substrate 11 is mainly due to the flexibility of the base film 12. The metal layer 14 is made of a metal having high thermal conductivity and conductivity, in this example, copper (Cu). The base film 12 may have an insulating property at least on the surface on the metal layer 14 side. The base material may be a material other than the resin, or may have a configuration including a plurality of layers made of different materials. In addition, since heat is transferred from the heat source Hs to the metal layer 14 via the base film 12, the base film 12 preferably has high thermal conductivity. The metal layer 14 may be made of any material having high thermal conductivity and conductivity, such as aluminum (Al) or gold (Au).

The wiring substrate 11 is roughly divided into three parts of a beam portion 20, a first leg portion 21, and a second leg portion 22. As will be described in detail later, the beam portion 20, the first leg portion 21, and the second leg portion 22 are obtained by curvedly deforming one wiring substrate 11 in which a cut is formed so as to be divided into a plurality of regions to be the respective portions of the beam portion 20, the first leg portion 21, and the second leg portion 22, and surfaces of the beam portion 20, the first leg portion 21, and the second leg portion 22 are continuous.

The beam portion 20 is formed in a strip shape. The beam portion 20 is curved or twisted according to the mounting state of the first leg portion 21 and the second leg portion 22 to the heat source Hs, and the degree thereof also changes. Hereinafter, the width direction of the beam portion 20, the first leg portion 21, and the second leg portion 22 will be described as a Y direction, the vertical direction in FIG. 1 will be described as a Z direction, and a direction (left-right direction in the drawing) orthogonal to the Y direction and the Z direction will be described as an X direction.

The beam portion 20 has a first connecting portion 20*a* and a second connecting portion 20*b* protruding in the Y direction from a side edge of each end portion in the X direction. The first connecting portion 20*a* protrudes from one side edge of one end portion of the beam portion 20 (side edge on front side in the drawing), and the second connecting portion 20*b* protrudes from the other side edge of the other end portion of the beam portion 20 (side edge on back side in the drawing). That is, the second connecting portion 20*b* protrudes in a direction opposite to the first connecting portion 20*a*. The widths (length in the Y direction) of the first connecting portion 20*a* and the second connecting portion 20*b* are the same as the widths of the first leg portion 21 and the second leg portion 22, respectively.

The first leg portion 21 includes a leg body 21*a* extending in a strip shape from the first connecting portion 20*a* and a first contact portion 21*b* provided at a distal end of the leg body 21*a*. The base end of the leg body 21*a* is connected to the end portion of the first connecting portion 20*a* on the other end side of the beam portion 20, and extends obliquely downward to the right in the drawing. That is, on the lower surface side of the beam portion 20 opposite to the metal layer 14, the leg body 21*a* is in a state of extending in the direction from the first connecting portion 20*a* to the other end side of the beam portion 20 (right direction in the drawing) and in the direction away from the beam portion 20 (downward in the drawing), and is inclined with respect to the beam portion 20.

In the first leg portion 21, the width of the distal end of the leg body 21*a* is wider than that of the leg body 21*a*, and the wide portion is the first contact portion 21*b*. The first contact portion 21*b* is mounted by, for example, attaching in a state where the lower surface thereof is in close contact with the heat source surface.

The second leg portion 22 includes a leg body 22*a* extending in a strip shape from the second connecting portion 20*b* and a second contact portion 22*b* provided at a distal end of the leg body 22*a*. The base end of the leg body 22*a* is connected to the end on one end side of the beam portion 20 of the second connecting portion 20*b*, and extends obliquely downward to the left in the drawing. In other words, on the lower surface side of the beam portion 20, the leg body 22*a* is in a state of extending from the second connecting portion 20*b* toward one end side of the beam portion 20 (leftward in the drawing) and away from the beam portion 20 (downward in the drawing), and is inclined with respect to the beam portion 20.

In the first leg portion 21, the width of the distal end of the leg body 21*a* is wider than that of the leg body 21*a*, and the wide portion is the first contact portion 21*b*. Similarly, in the second leg portion 22, the width of the distal end of the leg body 22*a* is wider than that of the leg body 22*a*, and the wide portion is the second contact portion 22*b*. The thermoelectric power generation device 10 is mounted to the heat source Hs by attaching the lower surfaces of the first contact portion 21*b* and the second contact portion 22*b* in close contact with the heat source surface, for example. The first contact portion 21*b* and the second contact portion 22*b* are in close contact with the heat source surface while being spaced apart from each other in the X direction. The first contact portion 21*b* and the second contact portion 22*b* also function as a pair of electrodes for extracting electric power of the thermoelectric power generation device 10. Note that, in this example, the first contact portion 21*b* and the second contact portion 22*b* are wider than the leg bodies 21*a* and 22*a*, but are not limited thereto, and may have the same width as the leg bodies 21*a* and 22*a*.

A first insulating region 27 that electrically isolates the metal layer 14 is provided between the base end and the distal end of the first leg portion 21 (leg body 21*a*), and a second insulating region 28 that electrically isolates the metal layer 14 is provided between the base end and the distal end of the second leg portion 22 (leg body 22*a*). In this example, the first insulating region 27 and the second insulating region 28 are formed as metal-free gaps in the metal layer 14. As a result, the metal layer 14 is electrically separated into a first wiring region 14*a* on the distal end side of the first leg portion 21, a second wiring region 14*b* on the distal end side of the second leg portion 22, and a connection wiring region 14*c* from the first insulating region 27 to the second insulating region 28 via the beam portion 20. The first wiring region 14*a* is a region of the metal layer 14 from the first contact portion 21*b* and the first contact portion 21*b* to the first insulating region 27, and the second wiring region 14*b* is a region of the metal layer 14 from the second contact portion 22*b* and the second contact portion 22*b* to the second insulating region 28.

The thermoelectric element E1 is of p-type, and is mounted at the position of the first insulating region 27, that is, on the leg body 21*a* to connect the first wiring region 14*a* and the connection wiring region 14*c* of the metal layer 14. The thermoelectric element E2 is of n-type, and is mounted at the position of the second insulating region 28, that is, on the leg body 22*a* to connect the second wiring region 14*b* and the connection wiring region 14*c* of the metal layer 14. The thermoelectric elements E1 and E2 are electrically connected to the first wiring region 14*a*, the second wiring region 14*b*, and the connection wiring region 14*c* by soldering, for example.

The mounting position of the thermoelectric element E1, that is, the formation position of the first insulating region 27 is set to a portion where the leg body 21*a* is not a curved base end portion but a flat surface. This prevents the thermoelectric element E1 from falling off or the like. Similarly, the mounting position of the thermoelectric element E2, that is, the formation position of the second insulating region 28 is set to a portion where the leg body 22*a* becomes a flat surface instead of the curved base end portion, and the thermoelectric element E2 is prevented from falling off or the like. From the viewpoint of separating the thermoelectric elements E1 and E2 from the heat source Hs to increase the temperature difference generated at both ends of the thermoelectric elements E1 and E2, it is preferable to provide the thermoelectric elements E1 and E2 at positions away from the distal ends of the leg bodies 21*a* and 22*a* and close to the base ends.

As described above, the thermoelectric power generation device 10 is mounted in a state where the first contact portion 21*b* and the second contact portion 22*b* are brought into close contact with the heat source surface of the heat source Hs. When the thermoelectric power generation device 10 is viewed from the Y direction, the second contact portion 22*b* is fixed at a position closer to one end side (left side in the drawing) of the beam portion 20 than the first contact portion 21*b* so that the leg body 21*a* and the leg body 22*a* intersect to form an X shape. Accordingly, the beam portion 20 is disposed above and away from the heat source Hs. In addition, since the leg bodies 21*a* and 22*a* are in a posture rising obliquely upward from the heat source surface, the thermoelectric elements E1 and E2 are arranged to be largely separated upward from the heat source surface. Such a three-dimensional structure of the wiring substrate 11 is to the same as what is called a kirigami structure in which a cut is formed in a sheet.

In the thermoelectric power generation device 10, the metal layer 14 mainly performs heat conduction, and the first wiring region 14*a* and the second wiring region 14*b* of the metal layer 14 transfer heat from the heat source Hs to one ends of the thermoelectric elements E1 and E2 to increase the temperature of the one ends. In addition, the connection wiring region 14*c*, mainly the region of the beam portion 20, radiates heat to effectively lower the temperature of the other ends of the thermoelectric elements E1 and E2. In this way, the temperature difference is generated in the thermoelectric elements E1 and E2, and the electromotive force generated in the thermoelectric power generation device 10 is extracted from the first contact portion 21*b* and the second contact portion 22*b*. Since the distance between the heat source surface of the heat source Hs serving as the high-temperature source and the beam portion 20 serving as the low-temperature source increases, high power generation efficiency can be obtained. In addition, since the thermoelectric elements E1 and E2 are disposed far above the heat source surface, higher power generation efficiency can be obtained.

By the way, the thermoelectric power generation device 10 has the above structure, and thus has a degree of freedom in which wiring substrate can be deformed without applying a force that drops the thermoelectric elements E1 and E2, and has a large degree of freedom in the shape of the heat source surface to which the wiring substrate 11 can be mounted. Therefore, the thermoelectric power generation device 10 can be mounted to a curved surface, for example, a cylindrical surface or a spherical surface to obtain high power generation efficiency.

Figure 2:
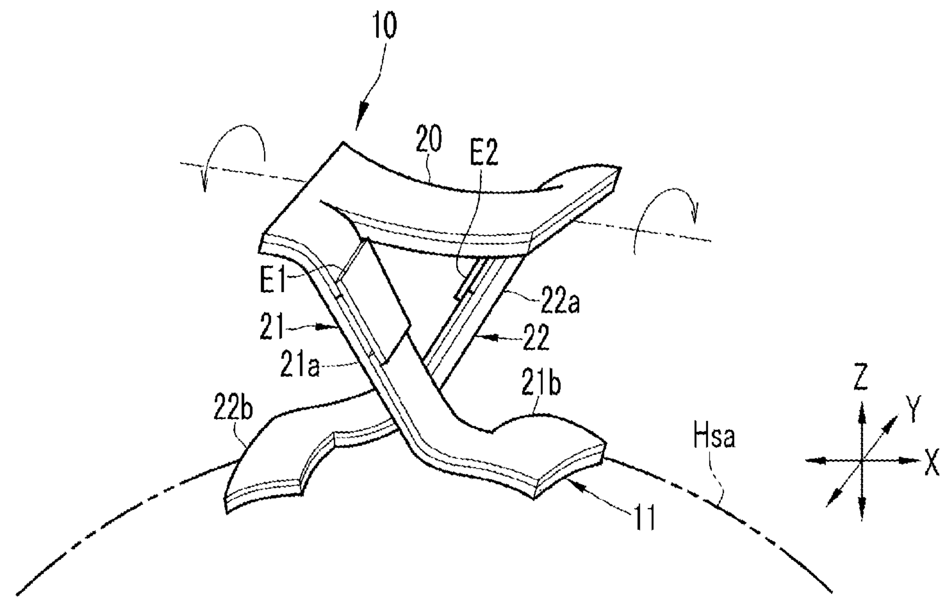
FIG. 2 is an explanatory diagram schematically illustrating a state in which a thermoelectric power generation device is mounted to a spherical surface.

FIG. 2 schematically illustrates the thermoelectric power generation device 10 mounted to spherical heat source surface Hsa. In a case where the thermoelectric power generation device 10 is mounted to the spherical heat source surface Hsa, the angle between the leg body 21*a* and the first contact portion 21*b* and the angle between the leg body 22*a* and the second contact portion 22*b* change in the circumferential direction of the heat source surface Hsa viewed in the Y direction, and the first contact portion 21*b* and the second contact portion 22*b* can be curved along the circumferential direction to be brought into close contact with the heat source surface Hsa.

On the other hand, the first contact portion 21*b* and the second contact portion 22*b* are curved also in the circumferential direction of the heat source surface Hsa viewed in the X direction, whereby the first contact portion 21*b* and the second contact portion 22*b* can be brought into close contact with the heat source surface Hsa. In this case, the respective positions of the distal ends of the first leg portion 21 and the second leg portion 22 on the heat source surface Hsa are shifted in the circumferential direction, and the leg bodies 21*a* and 22*a* are radially opened, but this radial opening is allowed by the deformation of the twist of the beam portion 20. Therefore, there is almost no deformation that generates a force to peel off the soldered thermoelectric elements E1 and E2 in the leg bodies 21*a* and 22*a*. Therefore, the first contact portion 21*b* and the second contact portion 22*b* can be brought into close contact with the heat source surface Hsa, and high power generation efficiency can be maintained.

The thermoelectric power generation device 10 can bring the first contact portion 21*b* and the second contact portion 22*b* into close contact with the heat source surface without applying a force that drops the thermoelectric elements E1 and E2 only by changing the degree of curvature between the base end portion and the distal end portion of the leg bodies 21*a* and 22*a* and the degree of inclination of the leg bodies 21*a* and 22*a* even if the interval between the first contact portion 21*b* and the second contact portion 22*b* in the X direction is changed. Further, as in the case where the leg bodies 21*a* and 22*a* are radially opened, even if the relative positions of the first contact portion 21*b* and the second contact portion 22*b* in the Y direction are changed by the deformation of the twist of the beam portion 20, the first contact portion 21*b* and the second contact portion 22*b* can be brought into close contact with the heat source surface. As described above, the thermoelectric power generation device 10 has a degree of freedom in mounting to the heat source surface, and accordingly, high power generation efficiency can be obtained.

Further, as described above, thermoelectric power generation device has a degree of freedom in mounting the first contact portion 21*b* and the second contact portion 22*b*, which means that the thermoelectric power generation device 10 can also cope with bending of the mounting surface of the heat source after the first contact portion 21*b* and the second contact portion 22*b* are fixed to the heat source.

Figure 3:
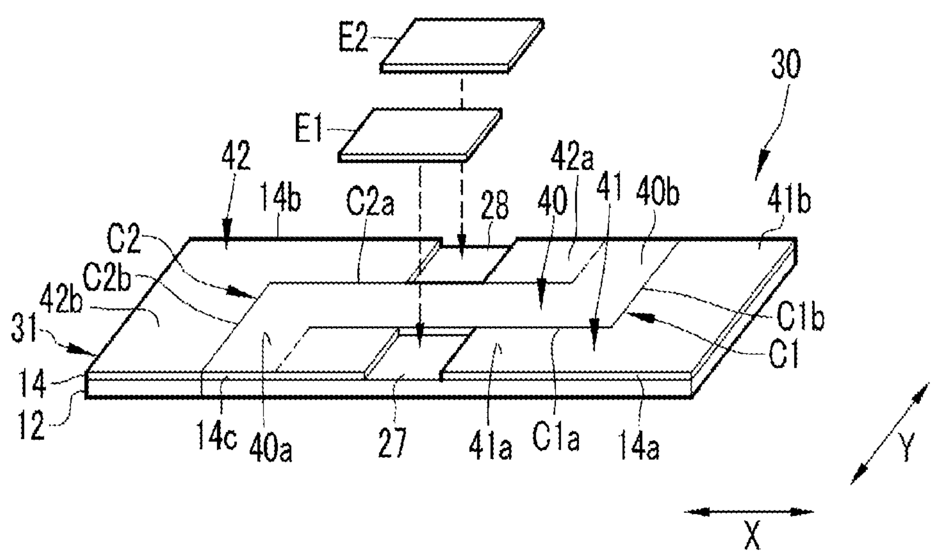
FIG. 3 is a perspective view illustrating a thermoelectric power generation device component.

FIG. 3 shows the thermoelectric power generation device component 30 to be the thermoelectric power generation device 10. The thermoelectric power generation device component 30 is obtained by mounting the thermoelectric elements E1 and E2 on a flat wiring substrate (hereinafter, referred to as a device component substrate) 31 on which cut lines C1 and C2 are formed as described later. The device component substrate 31 is three-dimensionally deformed to become the above-described wiring substrate 11, and has a structure in which a metal layer 14 is layered on the surface of the base film 12.

The device component substrate 31 has a rectangular shape and is divided into a beam portion region 40 to be the beam portion 20, a first leg portion region 41 to be the first leg portion 21, and a second leg portion region 42 to be the second leg portion 22 by cut lines C1 and C2. The beam portion region 40, the first leg portion region 41, and the second leg portion region 42 have shapes in which the beam portion 20, the first leg portion 21, and the second leg portion 22, which are three-dimensionally deformed, are planar. The first insulating region 27 is formed in the first leg portion region 41, the second insulating region 28 is formed in the second leg portion region 42, and the metal layer 14 is electrically separated into the first wiring region 14*a*, the second wiring region 14*b*, and the connection wiring region 14*c*.

The device component substrate 31 is manufactured by forming the cut lines C1 and C2 on a substrate in which the metal layer 14 is formed on the surface of the base film 12, and forming the first insulating region 27 and the second insulating region 28.

A method for forming the cut lines C1 and C2 is not particularly limited, and a method according to the material of the device component substrate 31 or the like may be used. For example, the cut lines C1 and C2 can be formed by laser processing. The cut lines C1 and C2 in the thermoelectric power generation device component 30 may not completely separate adjacent regions with the cut lines C1 and C2 interposed therebetween. For example, when attached to the heat source Hs, the cut lines C1 and C2 may be, for example, groove-shaped cuts that can be easily cut and separated at the portions. The above-described division of each region is to divide the device component substrate 31 into predetermined regions by the cut lines C1 and C2 together with the virtual boundary between the regions on the device component substrate 31.

The first insulating region 27 and the second insulating region 28 are formed by, for example, etching the metal layer 14. The method of forming the first insulating region 27 and the second insulating region 28 is not limited thereto. For example, when the metal layer 14 is formed on the surface of the base film 12 by vapor deposition, plating, or the like, portions to be the first insulating region 27 and the second insulating region 28 may be masked so that the metal layer 14 is not formed.

The beam portion region 40 is provided substantially at the center of the device component substrate 31 so as to extend in the longitudinal direction (X direction) of the device component substrate 31, and a first connecting portion region 40*a* and a second connecting portion region 40*b* protruding from side edges are formed at both ends thereof. The first connecting portion region 40*a* and the second connecting portion region 40*b* are regions to be the first connecting portion 20*a* and the second connecting portion 20*b*, and protrude in directions opposite to each other. Therefore, the beam portion region 40 is formed in a substantially point symmetrical shape with respect to substantially the center of the device component substrate 31.

The first leg portion region 41 extends in a strip shape from an end portion of the first connecting portion region 40*a* on the other end side of the beam portion region 40 toward the other end side of the beam portion region 40, and is provided in an L shape having a wide distal end so as to spread toward the beam portion region 40 side. In the first leg portion region 41, a leg body region 41*a* to be the leg body 21*a* extends along the beam portion region 40 (X direction), and a first contact portion region 41*b* that is widened to be the first contact portion 21*b* is adjacent to the other end of the beam portion region 40 including the second connecting portion region 40*b*.

The second leg portion region 42 extends in a strip shape from an end portion of the second connecting portion region 40*b* on one end side of the beam portion region 40 toward one end side of the beam portion region 40, and is provided in an L shape having a wide distal end so as to spread toward the beam portion region 40. In the second leg portion region 42, a leg body region 42*a* to be the leg body 22*a* extends along the beam portion region 40 (X direction), and a second contact portion region 42*b* that is widened to be the second contact portion 22*b* is adjacent to one end of the beam portion region 40 including the first connecting portion region 40*a*. The first leg portion region 41 and the second leg portion region 42 have shapes that are substantially point symmetrical with respect to substantially the center of the device component substrate 31.

The cut line C1 is formed at the boundary between the beam portion region 40 and the first leg portion region 41 except for the boundary between the first connecting portion region 40*a* and the base end of the first leg portion region 41. Therefore, the cut line C1 has an L shape, and includes a line portion C1*a* extending in the X direction and formed at a boundary dividing the beam portion region 40 and the leg body region 41*a* in the Y direction, and a line portion C1*b* extending in the Y direction and formed at a boundary dividing the beam portion region 40 and the first contact portion region 41*b* in the X direction.

Similarly, the cut line C2 is formed at the boundary between the beam portion region 40 and the second leg portion region 42 except for the boundary between the second connecting portion region 40*b* and the base end of the second leg portion region 42. Therefore, the cut line C2 has an L shape, and includes a line portion C2*a* extending in the X direction and formed at a boundary dividing the beam portion region 40 and the leg body region 42*a* in the Y direction, and a line portion C2*b* extending in the Y direction and formed at a boundary dividing the beam portion region 40 and the second contact portion region 42*b* in the X direction. The cut lines C1 and C2 are also point-symmetric with respect to substantially the center of the device component substrate 31.

The line portions C1*a* and C2*a* are shorter than the length (length in the X direction) of the device component substrate 31 and are formed to be shifted from each other in the X direction. The line portion C1*b* extends from one end protruding in the X direction from the line portion C2*a* of the line portion C1*a* to a side edge on the line portion C2*a* side of the device component substrate 31. Similarly, the line portion C2*b* extends from one end of the line portion C2*a* protruding in the X direction from the line portion C1*a* to a side edge on the line portion C1*a* side of the device component substrate 31.

Both ends of the thermoelectric element E1 are soldered to connect the first wiring region 14*a* and the connection wiring region 14*c* of the metal layer 14, and the thermoelectric element E1 is mounted on the leg body region 41*a*. Similarly, both ends of the thermoelectric element E2 are soldered to connect the second wiring region 14*b* and the connection wiring region 14c of the metal layer 14, and the thermoelectric element E2 is mounted on the leg body region 42a. As described above, the thermoelectric elements E1 and E2 can be easily mounted because the thermoelectric elements E1 and E2 are mounted on the flat-plate-like device component substrate 31.

The thermoelectric power generation device component 30 becomes the thermoelectric power generation device 10 by deforming the device component substrate 31 so as to raise the beam portion region 40 while raising the base ends of the first leg portion region 41 and the second leg portion region 42.

Figure 4:
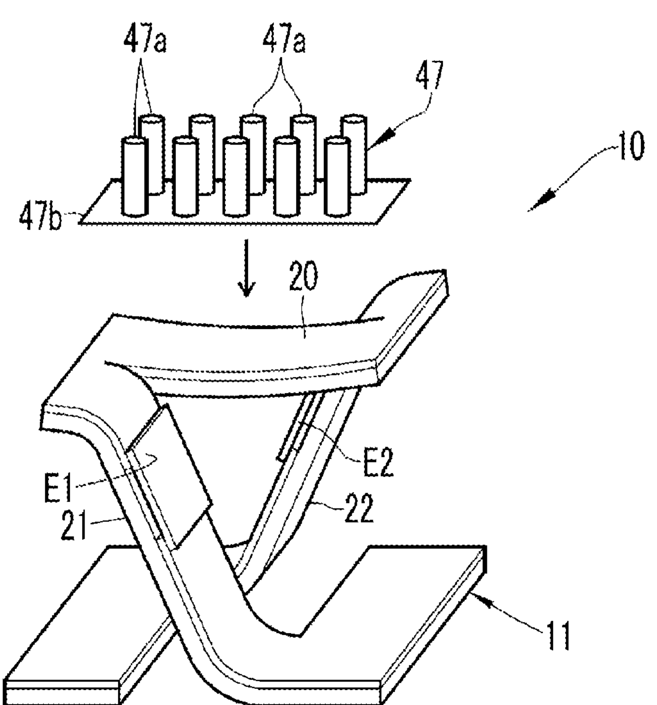
FIG. 4 is a perspective view illustrating a thermoelectric power generation device in which a heat sink is mounted to a beam portion.

FIG. 4 illustrates an example of the thermoelectric power generation device 10 in which the heat sink 47 having a plurality of fins 47a formed on an upper surface of the beam portion 20 is provided. The heat sink 47 is made of metal having high thermal conductivity, such as aluminum or copper, and is fixed to the upper surface of the beam portion 20. The heat sink 47 is mounted to the thermoelectric power generation device 10 by, for example, providing the fins 47a on the sheet-like base material 47b that can be easily deformed together with the beam portion 20 and attaching the base material 47b to the upper surface of the beam portion 20. As a result, the heat dissipation from the beam portion 20 is enhanced, and the power generation efficiency is further enhanced.

A thermoelectric power generation device to be described next is one in which thermoelectric elements are two-dimensionally arranged. Note that the other configurations are the same as those in the above example, and components having substantially the same functions are denoted by the same reference numerals, and the description thereof will be omitted.

Figure 5:
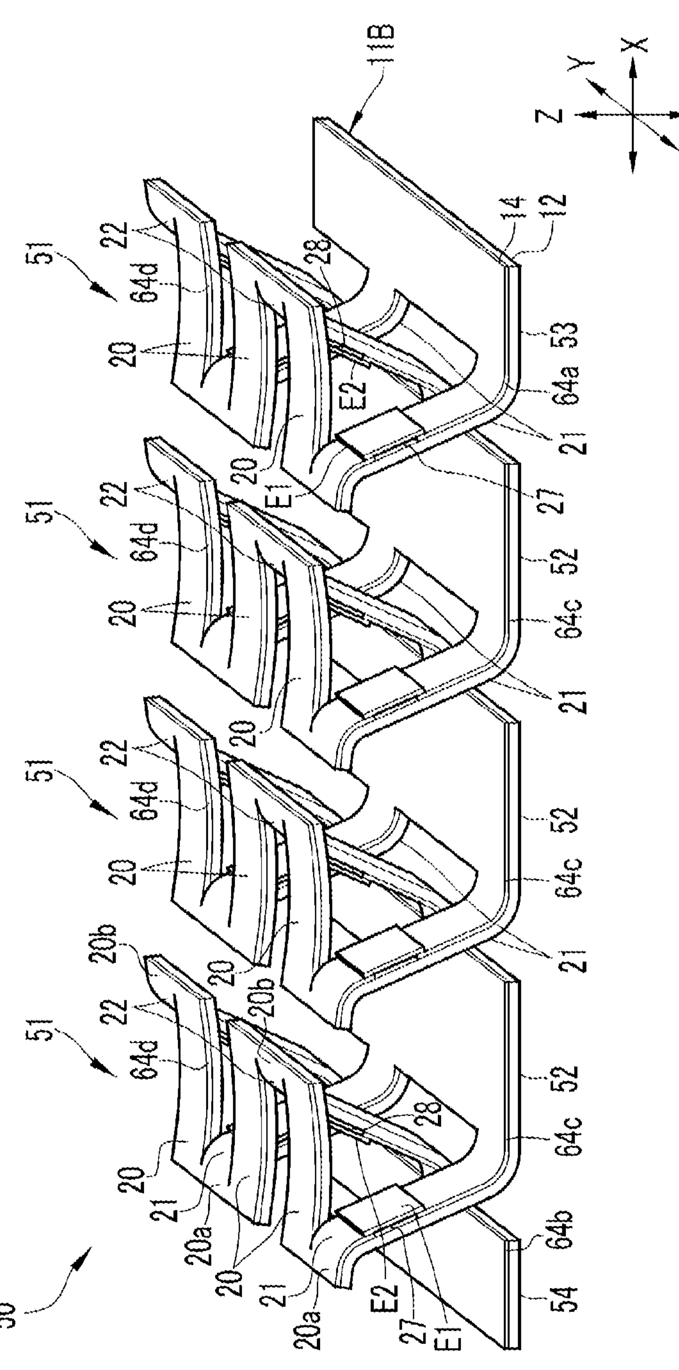
FIG. 5 is a perspective view illustrating a thermoelectric power generation device including a plurality of row modules.

In FIG. 5, the thermoelectric power generation device 50 is provided with a plurality of row modules 51 in the arrangement direction. The arrangement direction is a direction orthogonal to the width direction (Y direction) of the beam portion and the vertical direction (Z direction). Each row module 51 is connected by an intermediate contact portion 52 provided between two adjacent row modules 51, and is integrally formed as one wiring substrate 11B. The intermediate contact portion 52 is mounted in close contact with the heat source surface together with the first contact portion 53 and the second contact portion 54 provided at both ends in the X direction of the thermoelectric power generation device 50. Power of the thermoelectric power generation device 50 is extracted from the first contact portion 53 and the second contact portion 54 at both ends.

In each row module 51, the configuration of the beam portion 20, the first leg portion 21, and the second leg portion 22 is repeatedly arranged in the Y direction. More specifically, the plurality of beam portions 20, the plurality of first leg portions 21, and the plurality of second leg portions 22 are integrally formed such that the first leg portions 21 and the second leg portions 22 are alternately arranged with the beam portions 20 interposed therebetween. That is, the beam portion 20 is provided between the first leg portion 21 and the second leg portion 22, and base ends thereof are connected to the first connecting portion 20a and the second connecting portion 20b of the adjacent beam portion 20.

The first contact portion 53 common to the first leg portions 21 of the row modules 51 in the first row disposed at one end (right end in the drawing) of the thermoelectric power generation device 50 is integrally provided at a distal end of each first leg portion 21, and the second contact portion 54 common to the second leg portions 22 of the row modules 51 in the fourth row disposed at the other end (left end in the drawing) is integrally provided at a distal end of each second leg portion 22. The intermediate contact portion 52 is formed by integrating one of a first contact portion and a second contact portion disposed on the side of one row module 51 of two adjacent row modules 51 on the side of the other row module 51 and the other of the first contact portion and the second contact portion disposed on the side of one row module 51 of the other row module 51. That is, the intermediate contact portion 52 is integrally formed as a contact portion common to the distal end of the leg portion extending from one row module 51 of the two adjacent row modules 51 to the other row module 51 side and the distal end of the leg portion extending from the other row module 51 to the one row module 51 side.

In the illustrated example, for example, the intermediate contact portion 52 common to the second leg portion 22 extending from the row module 51 in the second row toward the row module 51 in the third row and the first leg portion 21 extending from the row module 51 in the third row toward the row module 51 in the second row is formed at the distal end of the second leg portion 22 and the first leg portion 21. The same applies to the intermediate contact portions 52 with respect to the row modules 51 in the first and second rows and the row modules 51 in the third and fourth rows.

In this example, the arrangement of the beam portion 20, the first leg portion 21, and the second leg portion 22 in the Y direction of each row module 51 is the same, but the positions of the first leg portion 21 in the Y direction and the positions of the second leg portion 22 in the Y direction may be shifted between adjacent row modules 51. In addition, the number of arrangements of the beam portion 20, the first leg portion 21, and the second leg portion 22 in each row module 51 is not limited, and more beam portions 20, first leg portions 21, and second leg portions 22 may be provided, or a set of the beam portion 20, the first leg portion 21, and the second leg portion 22 may be provided.

By providing the first insulating region 27 and the second insulating region 28 in each of the first leg portions 21 and each of the second leg portions 22, the metal layer 14 is formed with the first wiring region 64a, the second wiring region 64b, the three intermediate wiring regions 64c, and the four connection wiring regions 64d electrically separated from each other. The first wiring region 64a is a region of the metal layer 14 in which the region on the distal end side of each first leg portion 21 of the row module 51 in the first row and the region of the first contact portion 53 are integrated. The second wiring region 64b is a region of the metal layer 14 in which the region on the distal end side of each second leg portion 22 of the row module 51 in the fourth row and the region of the second contact portion 54 are integrated. The intermediate wiring region 64c is a region of the metal layer 14 in which the region of the intermediate contact portion 52 and the region on the distal end side of each first leg portion 21 and each second leg portion 22 integrated with the intermediate contact portion 52 as described above are integrated, and is formed for each intermediate contact portion 52. The connection wiring region 64d is provided for each row module 51, and is a region of the metal layer 14 in which a region on the base end side of the first insulating region 27 of each first leg portion 21, a region on the base end side of the second insulating region 28 of each second leg portion 22, and a region of each beam portion 20 are integrated.

In the thermoelectric power generation device 50 configured as described above, similarly to the thermoelectric power generation device 10 described above, the first leg portion 21 and the second leg portion 22 are hardly deformed to drop the thermoelectric elements E1 and E2, the surface shape of the heat source surface has a large degree of freedom, and the heat source surface can be mounted to a cylindrical surface or a spherical surface to obtain high power generation efficiency. It is also possible to cope with bending of the mounting surface of the heat source after fixing.

Figure 6:
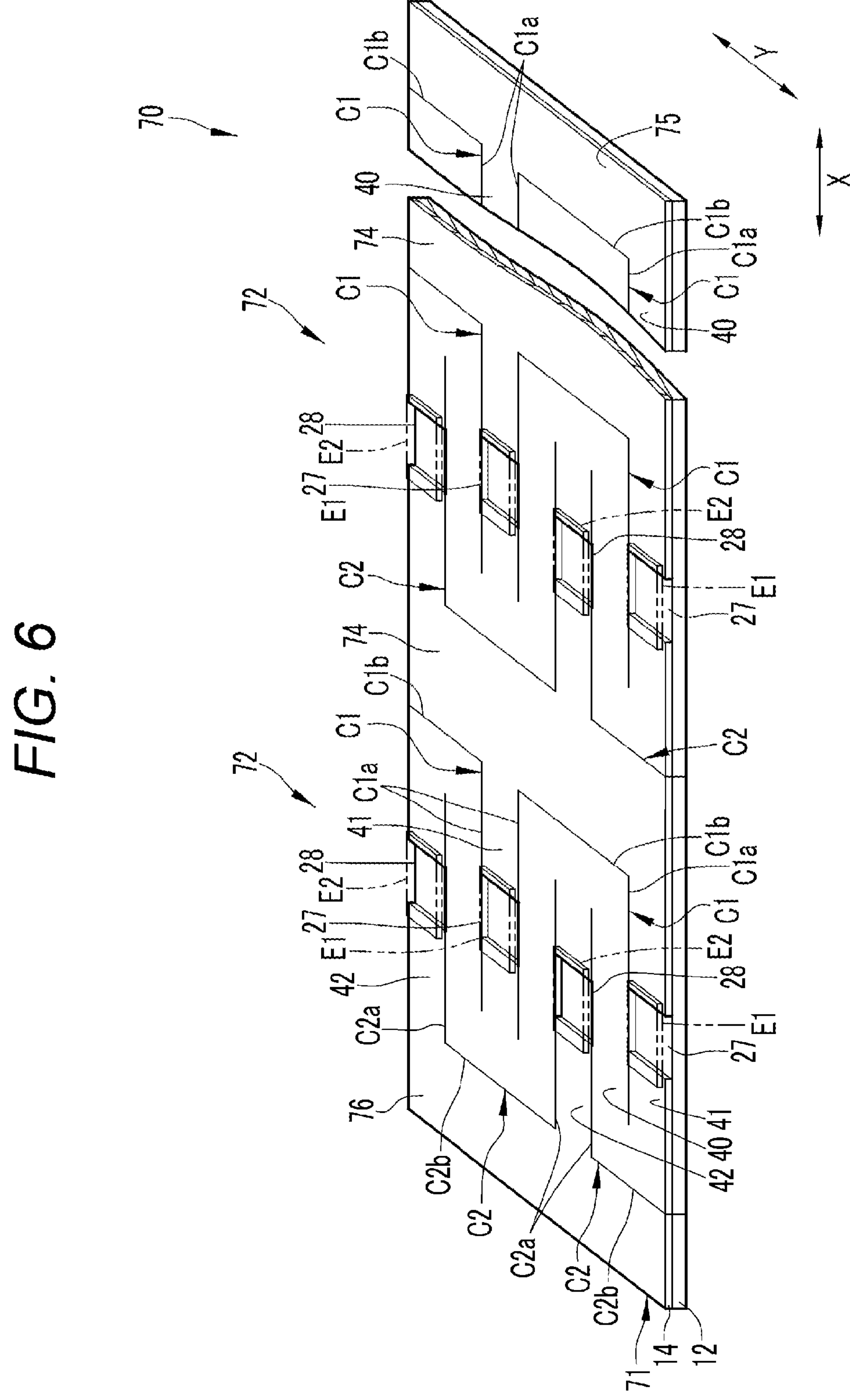
FIG. 6 is a perspective view illustrating a thermoelectric power generation device component having a plurality of row module regions.

FIG. 6 illustrates the thermoelectric power generation device component 70 that becomes the thermoelectric power generation device 50. In the thermoelectric power generation device component 70, a plurality of row module regions 72 corresponding to the respective row modules 51 are provided on the device component substrate 71 to be the wiring substrate 11B. The device component substrate 71 is three-dimensionally deformed to become the above-described wiring substrate 11B, and has a structure in which a metal layer 14 is layered on the surface of the base film 12.

Each row module region 72 is divided into the beam portion region 40, the first leg portion region 41, and the second leg portion region 42 by cut lines C1 and C2 in a corresponding pattern to the arrangement of the beam portion 20, the first leg portion 21, and the second leg portion 22. Further, an intermediate contact portion region 74 corresponding to the intermediate contact portion 52 is formed between the row module regions 72, and a first contact portion region 75 and a second contact portion region 76 corresponding to the first contact portion 53 and the second contact portion 54 are formed at both ends of the device component substrate 71. Although the metal layer 14 is separated into the first wiring region 64*a*, the second wiring region 64*b*, the intermediate wiring region 64*c*, and the connection wiring region 64*d* as described above by the cut lines C1 and C2, the first insulating region 27, and the second insulating region 28, illustration of these reference numerals is omitted in FIG. 6 in order to avoid complication of the drawing.

Similarly to the example illustrated in FIG. 3, the cut line C1 in the device component substrate 71 is formed at a boundary between the beam portion region 40 and the first leg portion region 41, a boundary between the beam portion region 40 and the intermediate contact portion region 74, and a boundary between the beam portion region 40 and the first contact portion region 75. The intermediate contact portion region 74 and the first contact portion region 75 correspond to the intermediate contact portion 52 and the first contact portion 53 which are integrated with the first leg portion 21. The cut line C1 includes a line portion C1*a* extending in the X direction and formed at a boundary dividing the beam portion region 40 and the portion extending in the X direction of the first leg portion region 41 in the Y direction, and a line portion C1*b* extending in the Y direction and formed at a boundary dividing the beam portion region 40 and the intermediate contact portion region 74 in the X direction, and a boundary dividing the beam portion region 40 and the first contact portion region 75 in the X direction.

The first leg portion region 41 sandwiched between the two beam portion regions 40 is defined by two cut lines C1. In addition, in a case where attention is paid to one first leg portion region 41, in a case where there is another first leg portion region 41 with the two beam portion regions 40 and the second leg portion region 42 disposed therebetween interposed therebetween with respect to the first leg portion region 41 of interest, a line portion C1*a* that partitions the first leg portion region 41 of interest on the side of the other first leg portion region 41 is connected to a line portion C1*a* that partitions the other first leg portion region 41 on the side of the first leg portion region 41 of interest via a line portion C1*b*, and thus, has a "U" shape.

The cut line C2 is the same as the cut line C1, and the cut line C2 is formed at a boundary between the beam portion region 40 and the second leg portion region 42, a boundary between the beam portion region 40 and the intermediate contact portion region 74, and a boundary between the beam portion region 40 and the second contact portion region 76. The intermediate contact portion region 74 and the second contact portion region 76 correspond to the intermediate contact portion 52 and the second contact portion 54 which are integrated with the second leg portion 22. The cut line C2 includes a line portion C2*a* extending in the X direction and formed at a boundary dividing the beam portion region 40 and the portion extending in the X direction of the second leg portion region 42 in the Y direction, and a line portion C2*b* extending in the Y direction and formed at a boundary dividing the beam portion region 40 and the intermediate contact portion region 74 in the X direction, and a boundary dividing the beam portion region 40 and the second contact portion region 76 in the X direction, and some of the cut lines C2 have a U shape.

In each of the above examples, the configuration using both the p-type thermoelectric element and the n-type thermoelectric element has been described. However, the thermoelectric power generation device may have a configuration in which only one thermoelectric element of the p-type thermoelectric element and the n-type thermoelectric element is provided on the first leg portion, for example. In this configuration, the metal layer may be electrically separated into a first wiring region on the distal end side of the first leg portion and a second wiring region from the first insulating region to the second contact portion via the beam portion by the first insulating region provided in the first leg portion, and the thermoelectric element may be mounted onto the first leg portion to connect the first wiring region and the second wiring region. The metal layer of the second leg portion to which the thermoelectric element is not mounted has a width narrower than that of the metal layer of the first leg portion to increase thermal resistance, so that a large temperature difference occurs between both ends of the thermoelectric element on the first leg portion. A method of narrowing the width of the metal layer of the second leg portion is not limited. For example, the width of the metal layer of the second leg portion can be narrowed by etching the metal layer or by a mask when the metal layer is formed on the surface of the base film by vapor deposition, plating, or the like. The formation of the first insulating region and the second insulating region and the processing of narrowing the width of the metal layer of the second leg portion may be performed simultaneously, or may be performed at different timings. The widths of the base films of the first leg portion and the second leg portion may be the same, and only the width of the metal layer of the second leg portion may be narrower than that of the first leg portion. In addition, the widths of the second leg portion itself, that is, the base film and the metal layer may be narrower than that of the first leg portion. In addition, it is also possible to form a row module using such a configuration and form a thermoelectric power generation device by the row module, and it is also possible to form a thermoelectric power generation device similar to the example of FIG. 5 by arranging a plurality of row modules.

Figure 7:
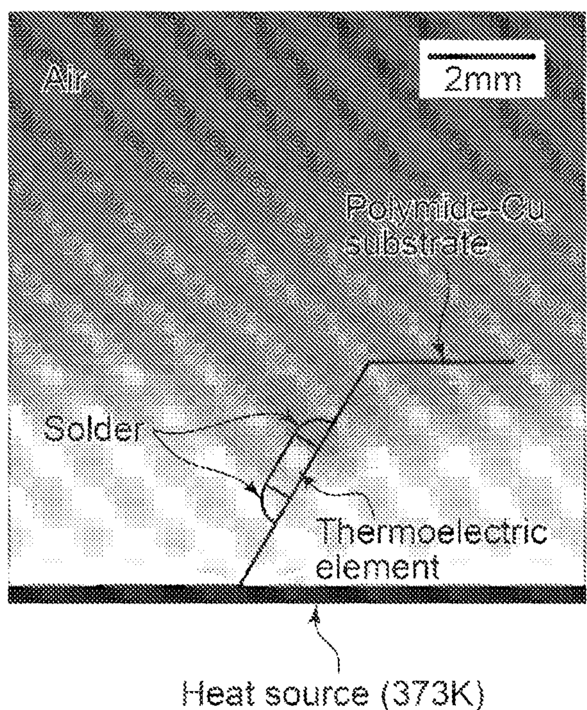
FIG. 7 is an image showing a numerical simulation result of temperature distribution around a thermoelectric power generation device.
Figure 8:
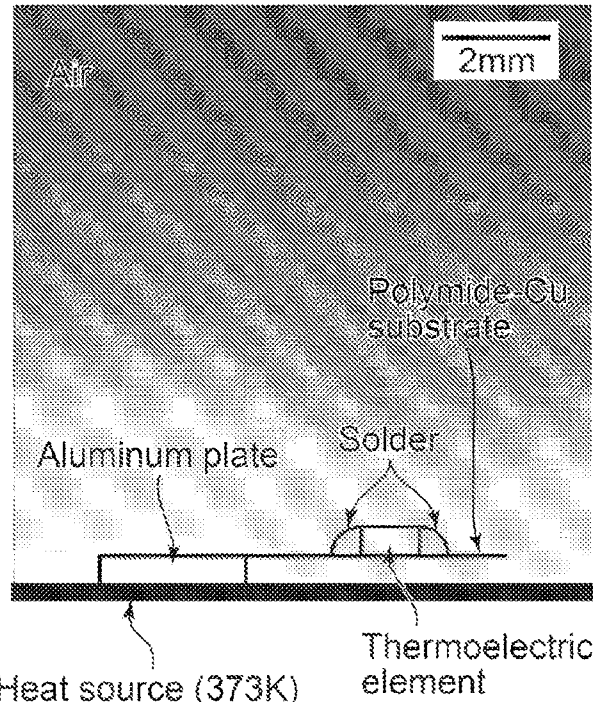
FIG. 8 is an image showing a numerical simulation result of temperature distribution around a thermoelectric power generation device imitating a n-type structure and a flat-type structure.
Figure 9:
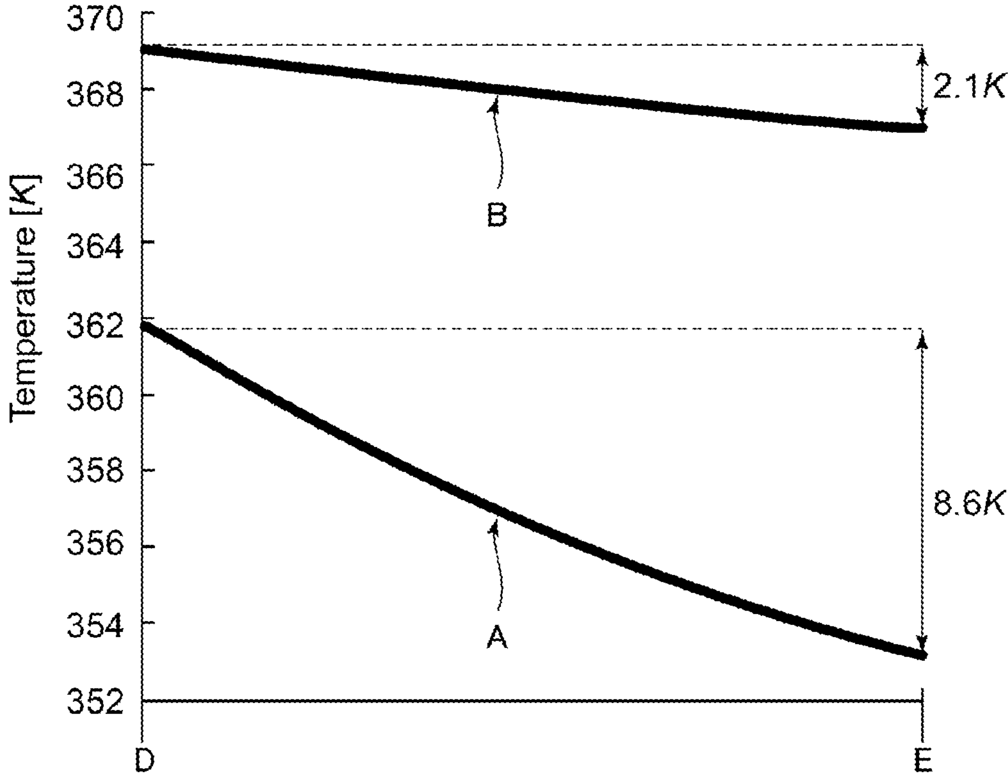
FIG. 9 is a graph showing a temperature distribution of thermoelectric elements in the numerical simulations of FIGS. 7 and 8.

FIG. 7 illustrates a simulation result of the temperature distribution around the leg portion (first leg portion 21 or second leg portion 22) and the beam portion 20 when the thermoelectric power generation device 10 configured as described above is mounted to the high-temperature heat source. This simulation result is a numerical simulation of a state in which the beam portion 20 is disposed above the heat source Hs in the atmosphere, and FIG. 7 shows that the higher the brightness, the higher the temperature. Similarly, FIG. 8 illustrates a numerical simulation of result temperature distribution in a case where a thermoelectric element is disposed on a substrate and the substrate is brought into close contact with a high-temperature heat source, imitating a thermoelectric power generation device having a general II-type structure or a flat-type structure. Further, FIG. 9 illustrates a temperature distribution in the thermoelectric element in the simulations illustrated in FIGS. 7 and 8. Note that a graph indicated by a reference sign A in FIG. 9 represents a thermoelectric power generation device 10, and a graph indicated by a reference sign B represents a thermoelectric power generation device having a n-type or flat-type structure.

As can be seen from the simulation results, in the thermoelectric power generation device 10, since the thermoelectric elements E1 and E2 are separated from the high-temperature heat source, the thermoelectric elements E1 and E2 can be disposed outside the temperature boundary layer, and a large temperature difference can be generated in the thermoelectric elements E1 and E2. On the other hand, in a thermoelectric power generation device having a general n-type structure or a flat-type structure, it can be seen that a thermoelectric element exists inside the temperature boundary layer, and a temperature difference hardly occurs in the thermoelectric element. Therefore, it can be seen that the power generation efficiency is improved by the structures of the thermoelectric power generation devices 10 and 50 and the like.

Figure 10:
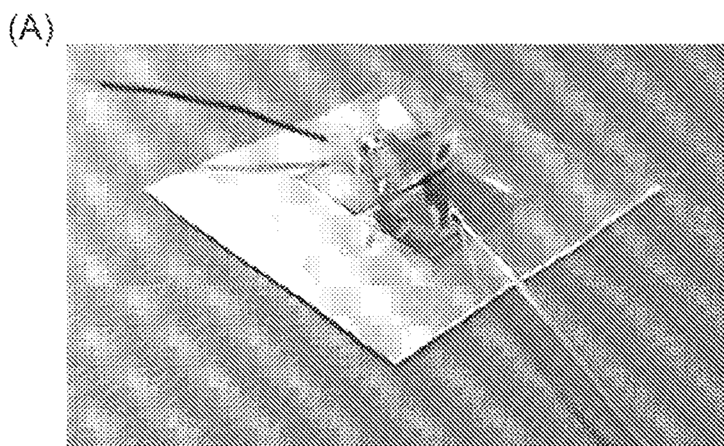
FIG. 10 is a photograph showing each thermoelectric power generation device when the power generation performance is verified.
Figure 10:
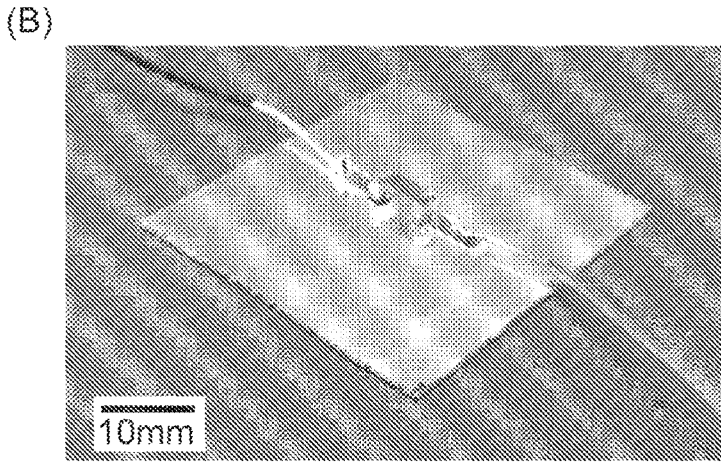
Figure 10:
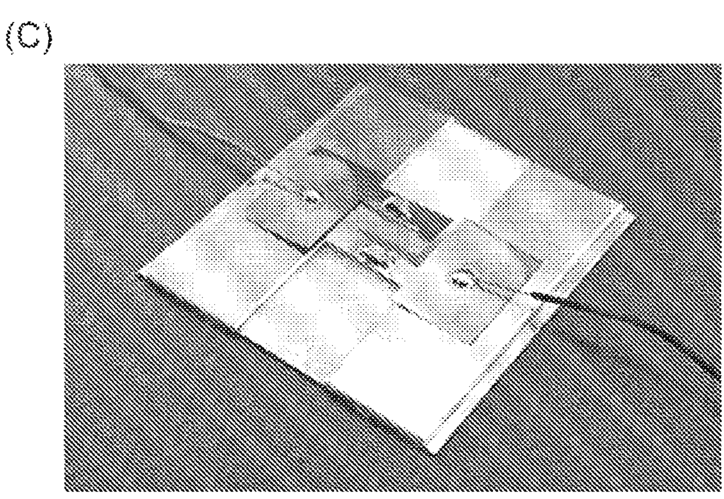

Next, the thermoelectric power generation devices having the n-type structure and the flat-type structure were produced together with the thermoelectric power generation device 10 having the above configuration, and the power generation performance was examined. The produced thermoelectric power generation device 10 is shown in FIG. 10(A), the thermoelectric power generation device having a n-type structure is shown in FIG. 10(B), and each thermoelectric power generation device having a flat-type structure is shown in FIG. 10(C). All the thermoelectric power generation devices were produced using thermoelectric elements having the same performance. The thermoelectric power generation device having the flat structure has a configuration in which the thermoelectric power generation device 10 is planarized, that is, has substantially the same configuration and shape as the thermoelectric power generation device component 30.

Figure 11:
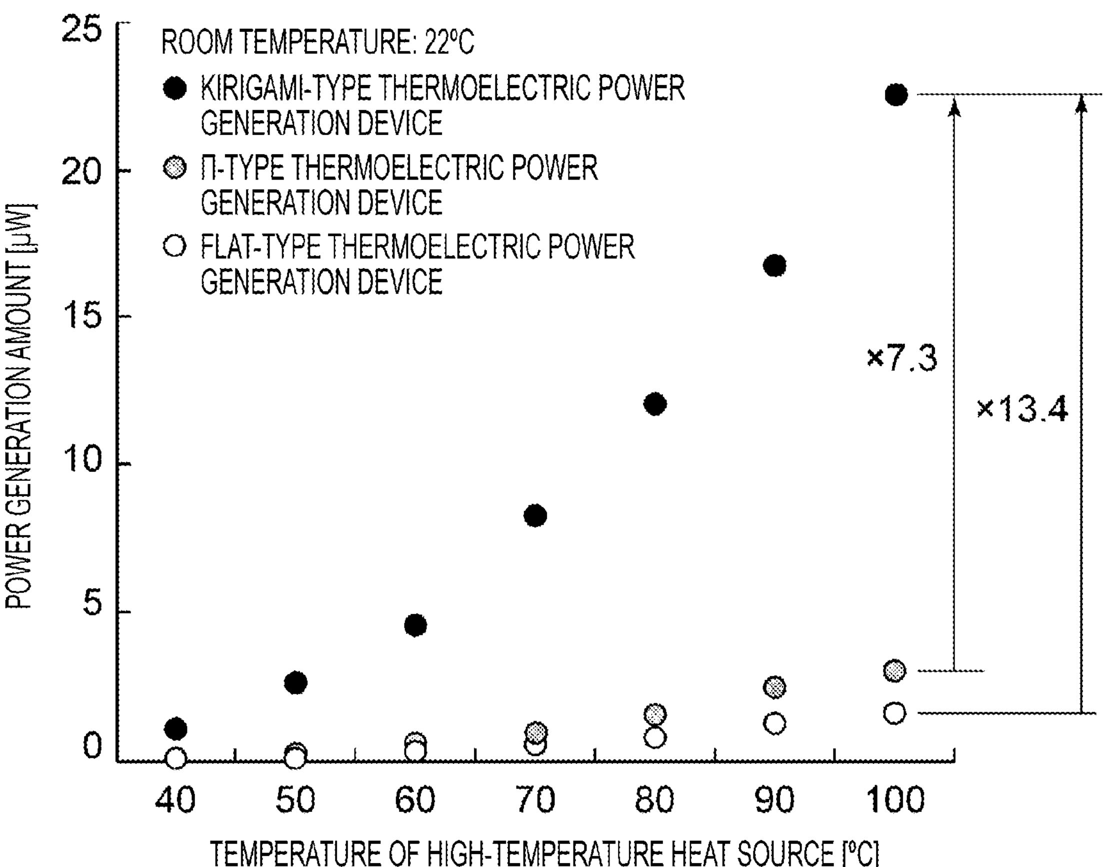
FIG. 11 is a graph showing a relationship between a temperature and a measured output of each thermoelectric power generation device in FIG. 10.

The wiring substrate used in the three types of thermoelectric power generation devices was a polyimide copper substrate having a metal layer made of copper (thickness: 8 μm) and a base film made of polyimide (thickness: 25 μm), and the thermoelectric element used was a BiTe thermoelectric element (p-type: $Bi_{0.3}Sb_{1.7}Te_3$, n-type: $Bi_2Te_3$+Ru, dimensions: 2×2×1 mm). The output (power generation amount) of each thermoelectric power generation device was measured when the heat source temperature was changed from 40° C. to 100° C. The measurement results are shown in FIG. 11. In FIG. 11, the measurement result of the thermoelectric power generation device 10 is illustrated as a kirigami-type thermoelectric power generation device. It was found that the thermoelectric power generation device 10 has high power generation efficiency, which is about 7.3 times higher than that of the thermoelectric power generation device having the n-type structure and about 13.4 times higher than that of the thermoelectric power generation device having the flat-type structure.

Figure 12:
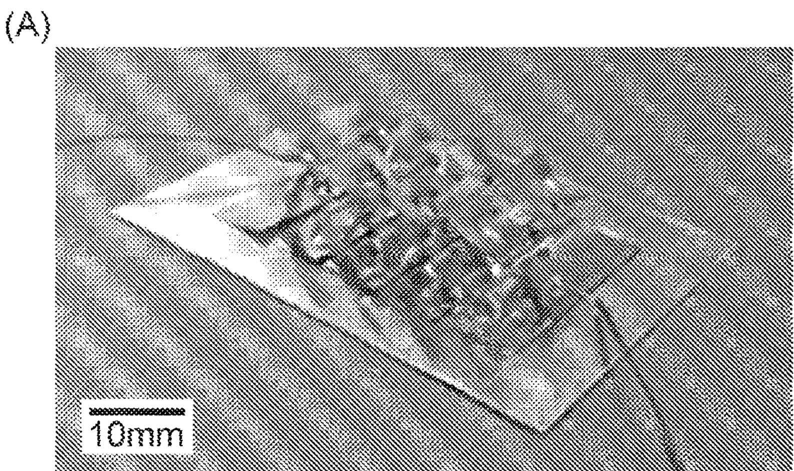
FIG. 12 is a photograph showing a thermoelectric power generation device including a plurality of row modules attached to a peripheral surface of a flat plate and a cylinder.
Figure 12:
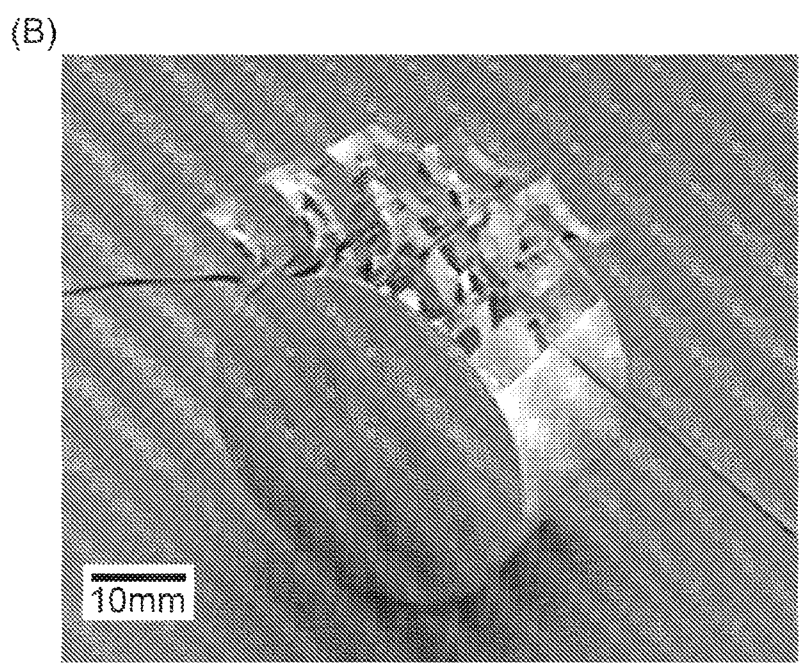

Further, thermoelectric power generation device shown in FIG. 5 was produced, and the power generation performance was verified when the thermoelectric power generation device 50 was attached to a curved surface. In this verification, the output of the thermoelectric power generation device 50 was measured for each of a case where the thermoelectric power generation device 50 was attached to a flat plate as a heat source and a case where the thermoelectric power generation device 50 was attached to a peripheral surface of a cylinder as a heat source. FIG. 12(A) illustrates a state in which the thermoelectric power generation device 50 is attached to a flat plate serving as a heat source, and FIG. 12(B) illustrates a state in which the thermoelectric power generation device is attached to a peripheral surface of substrate 11B a cylinder. The wiring and the thermoelectric elements E1 and E2 used in the thermoelectric power generation device 50 are the same as those described above.

Figure 13:
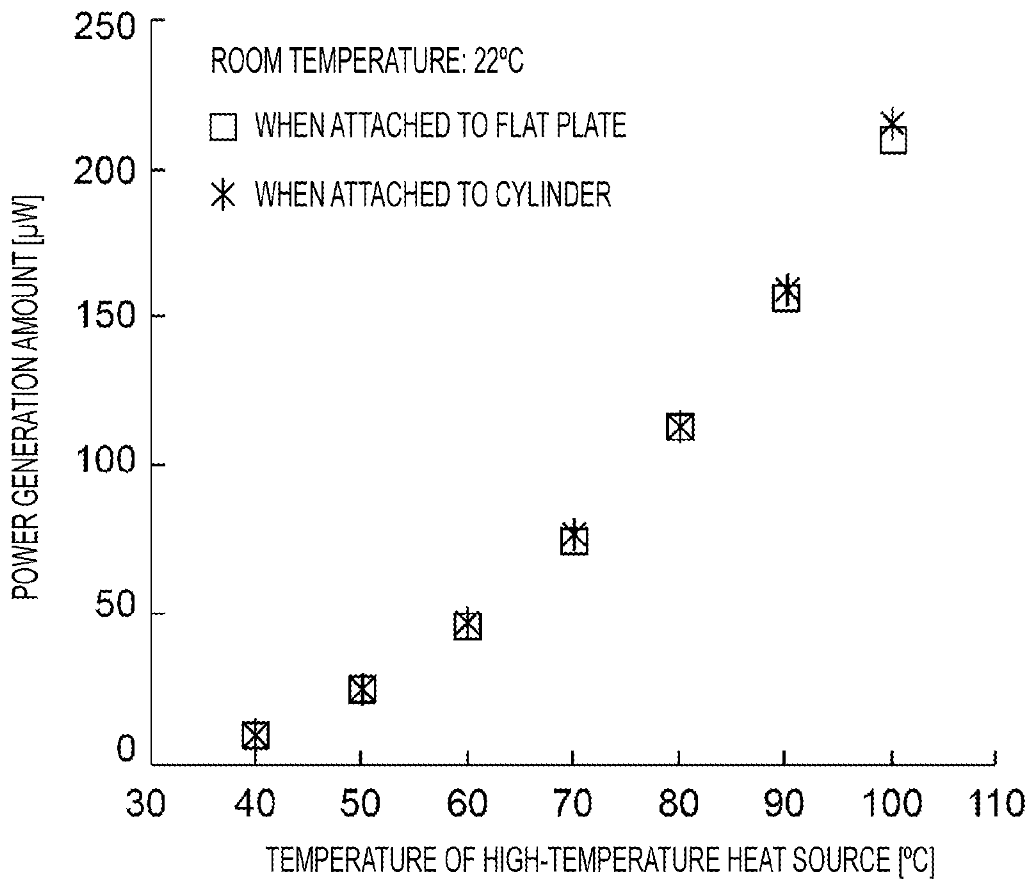
FIG. 13 is a graph showing a relationship between a temperature and an output of a thermoelectric power generation device attached to peripheral surfaces of a flat plate and a cylinder.

FIG. 13 shows respective results obtained by measuring outputs (power generation amounts) of the thermoelectric power generation devices 50. When the thermoelectric power generation device 50 was attached to a flat plate at a heat source temperature of 100° C., the output was 208 μW. In addition, in the case of being attached to the peripheral surface of the cylinder, the output was 214 μW. This indicates that even when the thermoelectric power generation device 50 is attached to a curved surface, thermoelectric power generation performance is substantially unchanged.

REFERENCE SIGNS LIST

10, 50: Thermoelectric power generation device
11, 11B: Wiring substrate
12: Base film
14: Metal layer
14*a*: First wiring region
14*b*: Second wiring region
14*c*: Connection wiring region
20: Beam portion
20*a*: First connecting portion
20*b*: Second connecting portion
21: First leg portion
21*a*, 22*a*: Leg body
21*b*, 53: First contact portion
22: Second leg portion
22*b*, 54: Second contact portion
27: First insulating region
28: Second insulating region
30, 70: Thermoelectric power generation device component
40: Beam portion region
40*a*: First connecting portion region
40*b*: Second connecting portion region
41: First leg portion region
41*b*, 75: First contact portion region
42: Second leg portion region
42*b*, 76: Second contact portion region
47: Heat sink
47*a*: Fin
51: Row module
52: Intermediate contact portion
64*a*: First wiring region
64*b*: Second wiring region

64*c*: Intermediate wiring region
64*d*: Connection wiring region
70: Thermoelectric power generation device component
72: Row module region
74: Intermediate contact portion region
C1, C2: Cut line
E1, E2: Thermoelectric element

The invention claimed is:

1. A thermoelectric power generation device comprising:

a flexible wiring substrate having an insulating base material and a metal layer formed on one surface of the base material; and a p-type thermoelectric element and an n-type thermoelectric element provided on the flexible wiring substrate, wherein the flexible wiring substrate includes:

a strip-shaped beam portion provided with a first connecting portion protruding outward in a width direction of the beam portion at one end and a second connecting portion protruding in a direction opposite to the first connecting portion at the other end;

a first leg portion extending in a strip shape from an end portion of the first connecting portion on the other end side of the beam portion toward the other end side of the beam portion in a direction away from the beam portion on one surface side of the beam portion, and having a distal end provided with a first contact portion which is configured to make surface contact with a surface of a heat source; and a second leg portion extending in a strip shape from an end portion of the second connecting portion on the one end side of the beam portion toward the one end side of the beam portion in a direction away from the beam portion on the one surface side of the beam portion, and having a distal end provided with a second contact portion that is configured to make surface contact with a surface of a heat source on the one end side of the beam portion with respect to the first contact portion, the metal layer is electrically separated into a first wiring region on the distal end side of the first leg portion, a second wiring region on the distal end side of the second leg portion, and a connection wiring region from a first insulating region to a second insulating region via the beam portion by the first insulating region formed between a base end and the distal end of the first leg portion and the second insulating region formed between a base end and the distal end of the second leg portion, the first insulating region being a first metal-free gap in the metal layer, and the second insulating region being a second metal-free gap in the metal layer, the p-type thermoelectric element is mounted on an upper portion of the connection wiring region adjacent to the first metal-free gap and an upper portion of the first wiring region adjacent to the first metal-free gap to connect the connection wiring region and the first wiring region, with the first metal-free gap sandwiched between the base material and the p-type thermoelectric element, and the n-type thermoelectric element is mounted on an upper portion of the connection wiring region adjacent to the second metal-free gap and an upper portion of the second wiring region adjacent to the second metal-free gap to connect the connection wiring region and the second wiring region, with the second metal-free gap sandwiched between the base material and the n-type thermoelectric element.

2. The thermoelectric power generation device according to claim 1, wherein a plurality of the first leg portions and a plurality of the second leg portions are alternately arranged in a width direction of the beam portion with the beam portion being sandwiched between the first leg portion and the second leg portion.

3. The thermoelectric power generation device according to claim 1, further comprising:

a plurality of row modules each including a set of the first leg portion, the second leg portion, and the beam portion, or a plurality of row modules in which a plurality of the first leg portions and a plurality of the second leg portions are alternately arranged in the width direction of the beam portion with the beam portion being sandwiched between the first leg portion and the second leg portion, wherein the plurality of row modules are arranged in a direction orthogonal to the width direction of the beam portion, and an intermediate contact portion is formed between adjacent row modules by integrating the first contact portion and the second contact portion, the intermediate contact portion connecting the first leg portion of one of the adjacent row modules and the second leg portion of the other of the adjacent row modules and making contact with the heat source.

4. The thermoelectric power generation device according to claim 1, wherein a heat sink having a plurality of fins is provided on a surface of the beam portion.

5. A thermoelectric power generation device component comprising:

a flexible planar wiring substrate having an insulating base material and a metal layer formed on one surface of the base material; and a p-type thermoelectric element and an n-type thermoelectric element provided on the flexible wiring substrate, wherein the flexible wiring substrate includes:

a strip-shaped beam portion region provided with a first connecting portion region protruding outward in a width direction of the beam portion region at one end and a second connecting portion region protruding in a direction opposite to the first connecting portion region at the other end;

a first leg portion region extending in a strip shape from an end portion of the first connecting portion region on the other end side of the beam portion region to the other end side of the beam portion region and having a distal end provided with a first contact portion region which is configured to make surface contact with a surface of a heat source; and a second leg portion region extending in a strip shape from an end portion of the second connecting portion region on the one end side of the beam portion region to the one end side of the beam portion region and having a distal end provided with a second contact portion region which is configured to make surface contact with a surface of a heat source, the beam portion region, the first leg portion region, and the second leg portion region being formed by cut lines, the metal layer is electrically separated into a first wiring region on the distal end side in the first leg portion region, a second wiring region on the distal end side in the second leg portion region, and a connection wiring region from a first insulating region to a second insulating region via the beam portion region by the first insulating region formed between a base end and the distal end of the first leg portion region and a second insulating region formed between a base end and the distal end of the second leg portion region, the first insulating region being a first metal-free gap in the metal layer, and the second insulating region being a second metal-free gap in the metal layer, the p-type thermoelectric element is mounted on an upper portion of the connection wiring region adjacent to the first metal-free gap and an upper portion of the first wiring region adjacent to the first metal-free gap to connect the connection wiring region and the first wiring region, with the first metal-free gap sandwiched between the base material and the p-type thermoelectric element, and the n-type thermoelectric element is mounted on an upper portion of the connection wiring region adjacent to the second metal-free gap and an upper portion of the second wiring region adjacent to the second metal-free gap to connect the connection wiring region and the second wiring region, with the second metal-free gap sandwiched between the base material and the n-type thermoelectric element.

6. The thermoelectric power generation device component according to claim 5, wherein the wiring substrate has a plurality of the first leg portions and a plurality of the second leg portions alternately arranged in a width direction of the beam portion region with the beam portion region being sandwiched between the first leg portion region and the second leg portion region.

7. The thermoelectric power generation device component according to claim 5, wherein the wiring substrate includes a plurality of row modules each including a set of the first leg portion region, the second leg portion region, and the beam portion region, or a plurality of row module regions in which a plurality of the first leg portion regions and a plurality of the second leg portion regions are alternately arranged in the width direction of the beam portion region with the beam portion region being sandwiched between the first leg portion region and the second leg portion region, and the plurality of row module regions are arranged in a direction orthogonal to the width direction of the beam portion, and an intermediate contact portion region is formed between adjacent row module regions by integrating the first contact portion region and the second contact portion region, the intermediate contact portion region connecting the first leg portion region of one of the adjacent row module regions and the second leg portion region of the other of the adjacent row module regions and making contact with the heat source.

8. The thermoelectric power generation device component according to claim 5, further comprising a heat sink having a plurality of fins mounted to a surface of the beam portion region.

9. A method for manufacturing a thermoelectric power generation device component, the method comprising:

a dividing step of forming cut lines on a flexible wiring substrate including an insulating base material and a metal layer formed on one surface of the base material to divide the flexible wiring substrate into a strip-shaped beam portion region provided with a first connecting portion region protruding outward in a width direction of the beam portion region at one end and a second connecting portion region protruding in a direction opposite to the first connecting portion region at the other end, a first leg portion region extending in a strip shape from an end portion of the first connecting portion region on the other end side of the beam portion region to the other end side of the beam portion region and having a distal end provided with a first contact portion region which is configured to make surface contact with a surface of a heat source, and a second leg portion region extending in a strip shape from an end portion of the second connecting portion region on the one end side of the beam portion region to the one end side of the beam portion region and having a distal end provided with a second contact portion region which is configured to make surface contact with a surface of a heat source;

a metal layer processing step of forming a first insulating region between a base end and the distal end of the first leg portion region and a second insulating region between a base end and the distal end of the second leg portion region, and electrically separating the metal layer into a first wiring region on the distal end side in the first leg portion region, a second wiring region on the distal end side in the second leg portion region, and a connection wiring region from the first insulating region to the second insulating region via the beam portion region, wherein the first insulating region is a first metal-free gap in the metal layer and the second insulating region is a second metal-free gap in the metal layer, and the first and second metal-free gaps are formed by etching the metal layer or forming the metal layer using a mask; and a thermoelectric element mounting step of mounting a p-type thermoelectric element on an upper portion of the connection wiring region adjacent to the first metal-free gap and an upper portion of the first wiring region adjacent to the first metal-free gap to connect the connection wiring region and the first wiring region with the first metal-free gap sandwiched between the base material and the p-type thermoelectric element, and mounting an n-type thermoelectric element on an upper portion of the connection wiring region adjacent to the second metal-free gap and an upper portion of the second wiring region adjacent to the second metal-free gap to connect the connection wiring region and the second wiring region with the second metal-free gap sandwiched between the base material and the n-type thermoelectric element.

10. The method for manufacturing a thermoelectric power generation device component according to claim 9, further comprising a heat sink mounting step of mounting a heat sink having a plurality of fins to a surface of the beam portion region.

* * * * *